United States Patent [19]

Popescu

[11] Patent Number: 5,315,176

[45] Date of Patent: May 24, 1994

[54] DIFFERENTIAL ECL CIRCUIT

[75] Inventor: Petre Popescu, Kanata, Canada

[73] Assignee: Northern Telecom Limited, Montreal, Canada

[21] Appl. No.: 111,961

[22] Filed: Mar. 26, 1993

Related U.S. Application Data

[63] Continuation of Ser. No. 838,171, Feb. 20, 1992, abandoned.

[51] Int. Cl.$^5$ .................... H03K 19/086; H03K 17/16
[52] U.S. Cl. ..................................... 307/455; 307/443
[58] Field of Search ................ 307/455, 443, 467, 454

[56] References Cited

U.S. PATENT DOCUMENTS

| | | | |
|---|---|---|---|
| 3,535,546 | 10/1970 | Davis | 307/216 |
| 4,628,216 | 12/1986 | Mazumder | 307/455 |
| 4,686,674 | 8/1987 | Lam | 370/112 |
| 4,866,306 | 9/1989 | Hopta | 307/455 |
| 4,963,767 | 10/1990 | Sinh | 307/455 |
| 5,065,060 | 11/1991 | Fernandez | 307/455 |
| 5,144,164 | 9/1992 | Sugimoto et al. | 307/455 |
| 5,170,079 | 12/1992 | Komatsu et al. | 307/455 |
| 5,200,651 | 4/1993 | Komatsu et al. | 307/455 |

FOREIGN PATENT DOCUMENTS 0312731 4/1989 European Pat. Off. .
1906757 12/1969 Fed. Rep. of Germany .

OTHER PUBLICATIONS

IBM Technical Disclosure Bulletin. vol. 9, No. 9, Feb. 1967, New York US pp. 1210-1211 Evans 'Exclucisve-Or Complement Circuit'.

Electronics Letters, Mar. 29, 1990, vol. 26, No. 7, "New High-Speed Bipolar XOR Gate with Absolutely Symmetrical Circuit Configuration", pp. 430-431, L. Schmidt and H.-M. Rein.

Electronics Letters, Oct. 12, 1989, vol. 25, No. 21, "Gbit/s Multiplexer IC Employing Submicron Si Bipolar Technology for use in Future Broadband Telecommunications Systems" pp. 1422-1423, M. Bagheri et al.

Primary Examiner—Edward P. Westin
Assistant Examiner—Richard Roseen
Attorney, Agent, or Firm—John E. Mowle

[57] ABSTRACT

A differential ECL (emitter coupled logic) circuit, with differential inputs and output and no series gates, comprises a plurality of transistor pairs. The differential ECL circuit can operate at high speed as there are no series gates and its noise margin is large because of differential operation. The differential circuit can be implemented into various logic circuits such as XOR (exclusive OR)/NXOR, OR/NOR, AND/NAND.

3 Claims, 4 Drawing Sheets

DIFFERENTIAL ECL CIRCUIT

This application is a continuation of application Ser. No. 07/838,171 filed Feb. 20, 1992 now abandoned.

FIELD OF THE INVENTION

The present invention relates generally to emitter coupled logic (ECL) circuits with differential inputs and output, and more particularly to a multiplexer and logic function circuits.

BACKGROUND OF THE INVENTION

A multiplexer or logic function circuit such as an exclusive OR (XOR), non-exclusive (NXOR), OR, NOR, AND or NAND circuit is usually formed on a semiconductor integrated circuit chip. For example, U.S. Pat. No. 4,963,767 dated Oct. 16, 1990 by Nguyen X. Sinh discloses an ECL (emitter coupled logic) multiplexer of non-differential type. U.S. Pat. No. 4,866,306 dated Sep. 12, 1989 by Daniel F. Hopta discloses an ECL multiplexer, which has series gates with differential outputs and non-differential inputs. U.S. Pat. No. 4,628,216 dated Dec. 9, 1986 by Nikhil C. Mazumder discloses multiplexers and XOR and other logic circuits. Also, ELECTRONICS LETTERS, 29th Mar. 1990, Vol.26, No.7, pp.430-431, shows a high speed XOR and ELECTRONICS LETTERS, 12th Oct. 1989, Vol. 25, No. 21, pp. 1422-1423, discloses a high speed multiplexer.

However, these prior art circuits have disadvantages—low speed, a small noise margin and/or a large power consumption—due to the use of series gates or non-differential type circuits.

SUMMARY OF THE INVENTION

The present invention provides differential ECL circuits (e.g. a multiplexer and logic function circuits), which overcome such disadvantages.

According to the most general aspect of the present invention, a differential ECL circuit comprises: a plurality of transistor pairs, each respectively comprising first and second transistors whose emitters are connected to each other; a plurality of constant current sources, each being connected between the connected emitters of each transistor pair and a first potential terminal; four load resistors connected between the first and second transistors' collectors of two transistor pairs and a second potential terminal; an emitter follower circuit comprising four emitter follower transistors and two emitter resistors; and means for providing a plurality of differential input signals to the transistor pairs. In the differential ECL circuit, at least some of the first and second transistors' collectors of each of the transistor pairs to which the four load resistors are connected, are connected to the counterparts of the other transistor pairs. The bases of the four emitter follower transistors are connected to the first and second transistors' collectors of the transistor pairs to which the four load resistors are connected. The emitters of the two emitter follower transistors are connected to the first potential terminal through the one emitter resistor. The emitters of the other two emitter follower transistors are connected to the first potential terminal through the other emitter resistor. A differential output signal is provided across the emitter resistors, depending upon logic states of the differential input signals.

Preferably in any one differential ECL circuit, all of the transistors are of the same NPN (PNP) type and the first and second potential terminals are low and high (high and low) potential terminals, respectively.

In response to the differential input and select signals, the transistor pairs function as logic circuits (e.g. XOR, OR, AND).

The differential ECL circuit has no series gates. Therefore, its speed is high and propagation times from any input to the output are the same and the circuit is symmetrical. Also, due to the differential input and outputs, it has very good noise margin characteristics.

BRIEF DESCRIPTION OF THE DRAWINGS

An embodiment of the present invention will now be described by way of example only with reference to the accompanying drawings in which.

DETAILED DESCRIPTION OF PREFERRED EMBODIMENT

1. MULTIPLEXER

First, an embodiment multiplexer according to the prior art is described.

I. Structure of the Multiplexer

Figure 1:
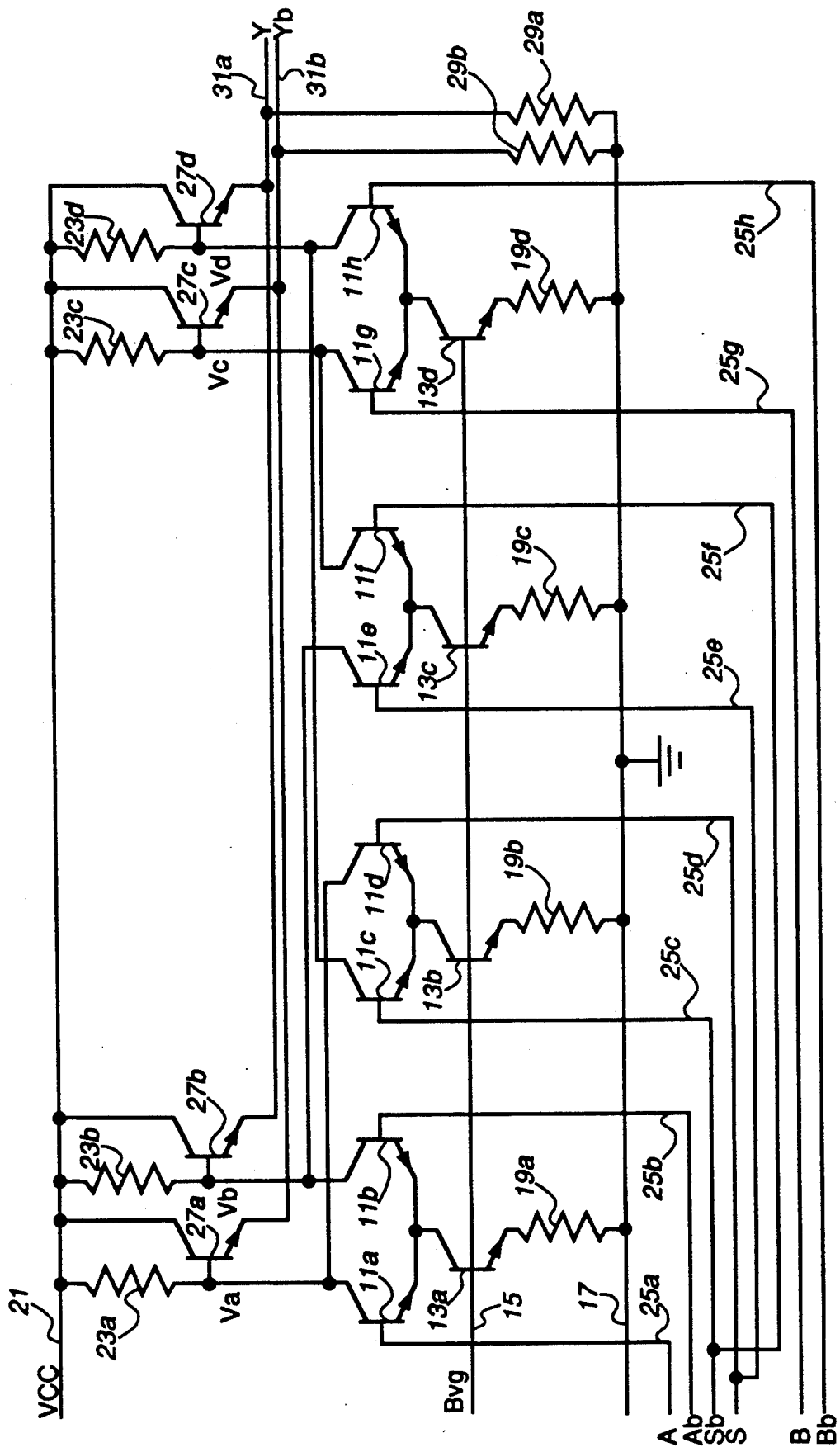
FIG. 1 is a schematic diagram of a multiplexer according to the prior art.

Referring to FIG. 1, the multiplexer comprises four differential transistor pairs and four constant current sources, which are connected to the transistor pairs. In each transistor pair, the emitters of two transistors 11a, 11b; 11c, 11d; 11e, 11f; and 11g, 11h are mutually coupled. The constant current sources comprise transistors 13a–13d, the collectors of which are connected to the coupled emitters of transistor pairs, the bases of which are connected to a common bias voltage line 15, and the emitters of which are connected to a ground line 17 through resistors 19a–19d. The ground line 17 is the reference potential line in this circuit (a low potential line). A positive DC voltage Bvg (typically 2.0 volts) is fed to the common bias voltage line 15.

The collectors of the transistors 11c, 11d, 11e and 11f are connected to the collectors of the transistors 11h, 11a, 11b and 11g, respectively. The collectors of the transistors 11a, 11b, 11g and 11h are connected to a voltage supply line 21 through resistors 23a–23d, respectively. Another positive DC voltage VCC (typically 4.5 volts) is fed to the voltage supply line 21.

Input lines 25a–25h are connected to the bases of the transistors 11a–11h so as to feed first and second differential input signals and a differential select signal to the transistor pairs. The input lines 25c and 25f, or the bases of the transistors 11c and 11f, are connected to each other. The input lines 25d and 25e, or the bases of the transistors 11d and 11e, are connected to each other.

The multiplexer also comprises an emitter follower circuit including four transistors 27a–27d, the bases of which are connected to the collectors of the transistors 11a, 11b, 11g and 11h, respectively. Both emitters of the transistors 27b and 27d are connected to the ground line 17 through a resistor 29a. Similarly, both emitters of the transistors 27a and 27c are connected to the ground line 17 through a resistor 29b. Output lines 31a and 31b are connected to the emitters of transistors 27b, 27d and 27a, 27c, respectively, so as to provide a differential output signal across both resistors 29a and 29b.

II. Operation of the Multiplexer

Each of the first and second differential input signals and the differential select signal consists of non-inverted and inverted phase components. The non-inverted and inverted phase components A and Ab of the first differential input signal are fed to the input lines 25a and 25b, respectively. The non-inverted and inverted phase components B and Bb of the second differential input signal are fed to the input lines 25g and 25h, respectively. The non-inverted and inverted phase components S and Sb of the differential select signal are fed to the input lines 25d, 25e and 25c, 25f, respectively.

When a select signal voltage Vss, which is the potential difference between the non-inverted and inverted phase components S and Sb, is negative or positive, the logic level of the differential select signal is "0" or "1", respectively. Also, when each of voltages Vsa and Vsb of the first and second differential input signals is negative or positive, its logic level is "0" or "1", respectively.

With the voltage Bvg being fed to the bases of the transistors 13a-13d, a constant current flows in the connected emitters of each transistor pair, so that the total current Io flowing in the collectors of each transistor pair is constant. In the following description, when a differential signal is fed to the bases of the transistor pair, the current Io flows in either one or the other transistor of that pair. Voltage drops between bases and emitters of the transistors are ignored. The four resistors 23a, 23b, 23c and 23d have the same resistance R. Base potentials of the transistors 27a, 27b, 27c and 27d are referred to as Va, Vb, Vc and Vd, respectively.

In response to the input and select signals, the transistors of the four transistor pairs function as a differential ECL circuit. Table I shows the relationship between the input signal voltages, the base potentials of the transistor pairs and the output voltage for both negative and positive select signal voltages.

Under the negative select signal voltage Vss, when both first and second input signal voltages Vsa and Vsb are negative, the current Io flows in each of the transistors 11b, 11c, 11f and 11h. Since the base-emitters of the transistors 27c and 27d are reverse-biased, they are non-conductive. Output potentials V(Y) and V(Yb) at the output lines 31a and 31b are nearly equal to the base potentials Vb and Va, respectively, so that the output signal voltage, V(Y)−V(Yb), is negative (or logic "0"). Likewise, when the first and second input signal voltages Vsa and Vsb are negative and positive, respectively, the transistors 11b, 11c, 11f and 11g are conductive. When the first and second input signal voltages Vsa and Vsb are positive and negative, respectively, the transistors 11a, 11c, 11f and 11h are conductive. When both first and second input signal voltages Vsa and Vsb are positive, the transistors 11a, 11c, 11f and 11g are conductive.

Under the positive select signal voltage Vss, when both first and second input signal voltages Vsa and Vsb are negative, the current Io flows in each of the transistors 11b, 11d, 11e and 11h. When the first and second input signal voltages Vsa and Vsb are negative and positive, respectively, the transistors 11b, 11d, 11e and 11g are conductive. When the first and second input signal voltages Vsa and Vsb are positive and negative, respectively, the transistors 11a, 11d, 11e and 11h are conductive. When both first and second input signal voltages Vsa and Vsb are positive, the transistors 11a, 11d, 11e and 11g are conductive.

As a result, the logic output signals which correspond to the first or second input signals selected by the select signal, are provided from the output lines 31a and 31b.

2. XOR CIRCUIT

Second, an embodiment XOR circuit according to the present invention is described.

I. Structure of the XOR circuit

Figure 2:
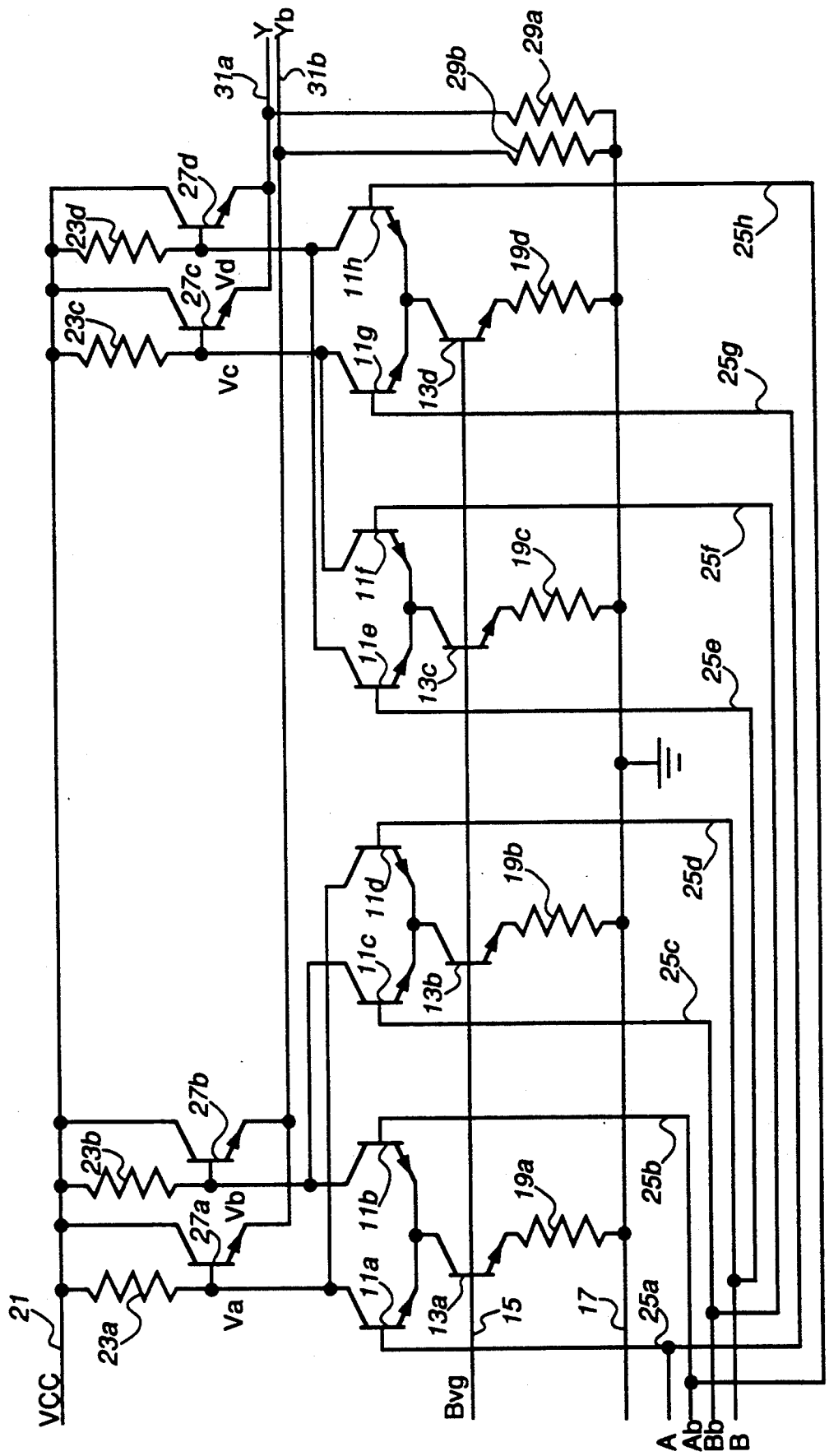
FIG. 2 is a schematic diagram of an XOR circuit according to the present invention.

As shown in FIG. 2, the collectors of the transistors 11c and 11d are connected to the collectors of the transistors 11b and 11a, respectively. The collectors of the transistors 11e and 11f are connected to the collectors of the transistors 11h and 11g, respectively. The input lines 25a and 25g, or the bases of the transistors 11a and 11g, are connected to each other. The input lines 25b and 25h, or the bases of the transistors 11b and 11h, are connected to each other. The input lines 25c and 25f, or the bases of the transistors 11c and 11f, are connected to each other. The input lines 25d and 25e, or the bases of the transistors 11d and 11e, are connected to each other. The output lines 31a and 31b are connected to the emitters of transistors 27c, 27d and 27a, 27b, respectively. The other connections are the same as those of the circuit shown in FIG. 1.

II. Operation of the XOR circuit

In the XOR circuit shown in FIG. 2, compared to the multiplexer shown in FIG. 1, the non-inverted and inverted phase components B and Bb of the second differential input signal, instead of the non-inverted and inverted phase components S and Sb of the differential select signal, are fed to the bases of the transistors 11d, 11e and 11c, 11f, respectively. The non-inverted and inverted phase components A and Ab of the first differential input signal, instead of the non-inverted and inverted B and Bb of the second differential input signal, are fed to the bases of the transistors 11g and 11h, respectively.

In response to the differential input signals, the transistors of the four transistor pairs function as a logic circuit. Table II shows the relationship between the input signal voltages, the base potentials of the transistor pairs and the output voltage.

When both first and second input signal voltages Vsa and Vsb are negative, the current Io flows in each of the transistors 11b, 11c, 11f and 11h. Similarly, when the first and second input signal voltages Vsa and Vsb are negative and positive, respectively, the transistors 11b, 11d, 11e and 11h are conductive. When the first and second input signal voltages Vsa and Vsb are positive and negative, respectively, the transistors 11a, 11c, 11f and 11g are conductive. When both first and second input signal voltages Vsa and Vsb are positive, the transistors 11a, 11d, 11e and 11g are conductive.

As a result, the output signals from the output lines 31a and 31b are of the XOR logic on the basis of the first and second input signals.

3. OR CIRCUIT

Third, an embodiment OR circuit according to the present invention is described.

I. Structure of the OR circuit

Figure 3:
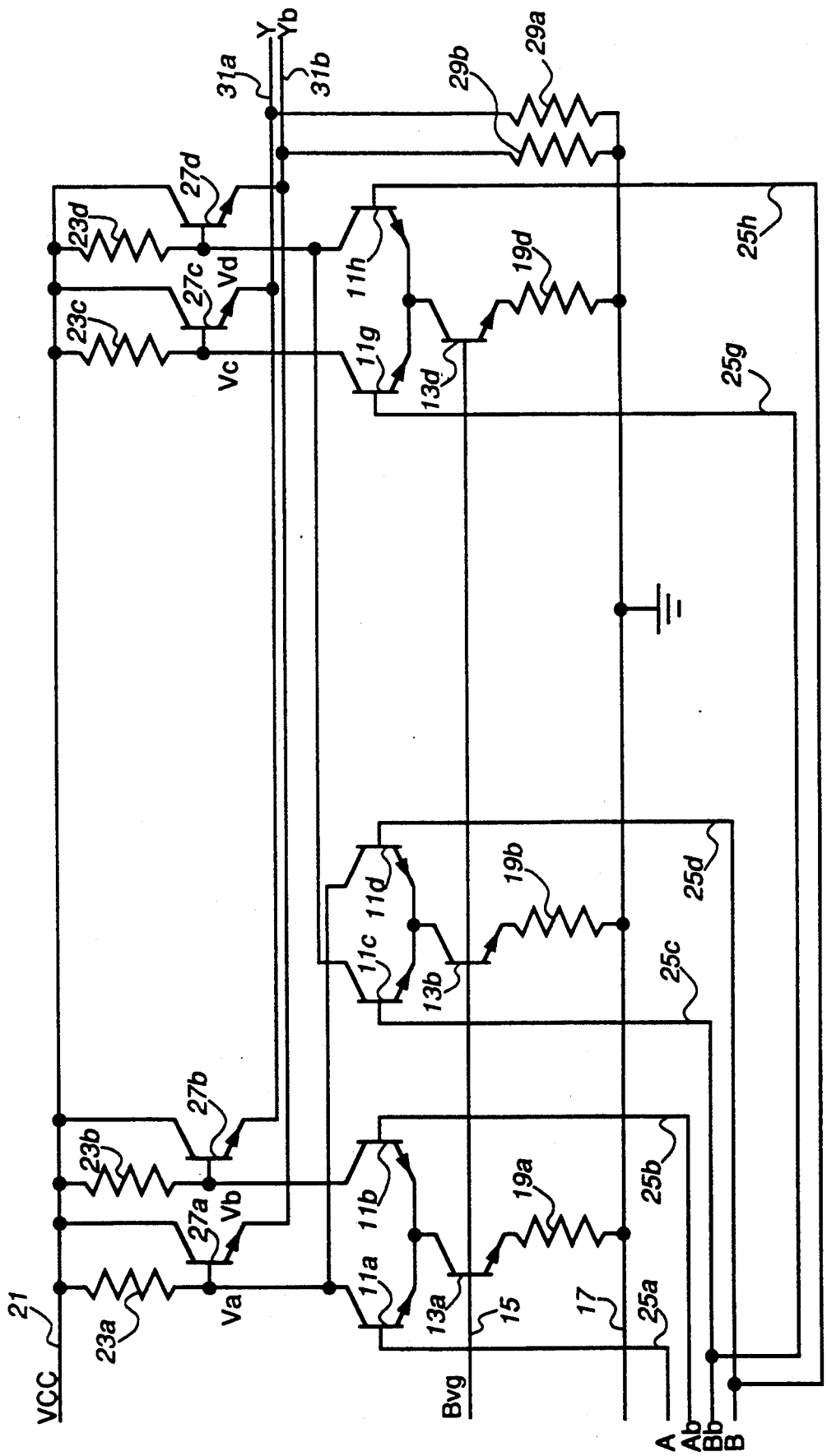
FIG. 3 is a schematic diagram of an OR circuit according to the present invention.

As shown in FIG. 3, the OR circuit has a similar circuit structure as the multiplexer shown in FIG. 1. The transistors 11e and 11f and their related circuits and connections are deleted. The input lines 25c and 25g, or the bases of the transistors 11c and 11g, are connected to each other. The input lines 25d and 25h, or bases of the transistors 11d and 11h, are connected to each other. The output lines 31a and 31b are connected to the emitters of transistors 27b, 27c and 27a, 27d, respectively.

II. Operation of the OR circuit

In the OR circuit shown in FIG. 3, compared to the multiplexer shown in FIG. 1, the non-inverted and inverted phase components B and Bb of the second differential input signal, instead of the non-inverted and inverted phase components S and Sb of the differential select signal, are fed to the bases of the transistors 11d, 11h and 11c, 11g, respectively. Table III shows the relationship between the input signal voltages, the base potentials of the transistor pairs and the output voltage.

When both first and second input signal voltages Vsa and Vsb are negative, the current Io flows in each of the transistors 11b, 11c, and 11g. Similarly, when the first and second input signal voltages Vsa and Vsb are negative and positive, respectively, the transistors 11b, 11d, and 11h are conductive. When the first and second input signal voltages Vsa and Vsb are positive and negative, respectively, the transistors 11a, 11c, and 11g are conductive. When both first and second input signal voltages Vsa and Vsb are positive the transistors 11a, 11d and 11h are conductive.

As a result, the output signals from the output lines 31a and 31b are of the OR logic on the basis of the first and second input signals.

4. AND CIRCUIT

Fourth, an embodiment AND circuit according to the present invention is described.

I. Structure of the AND circuit

Figure 4:
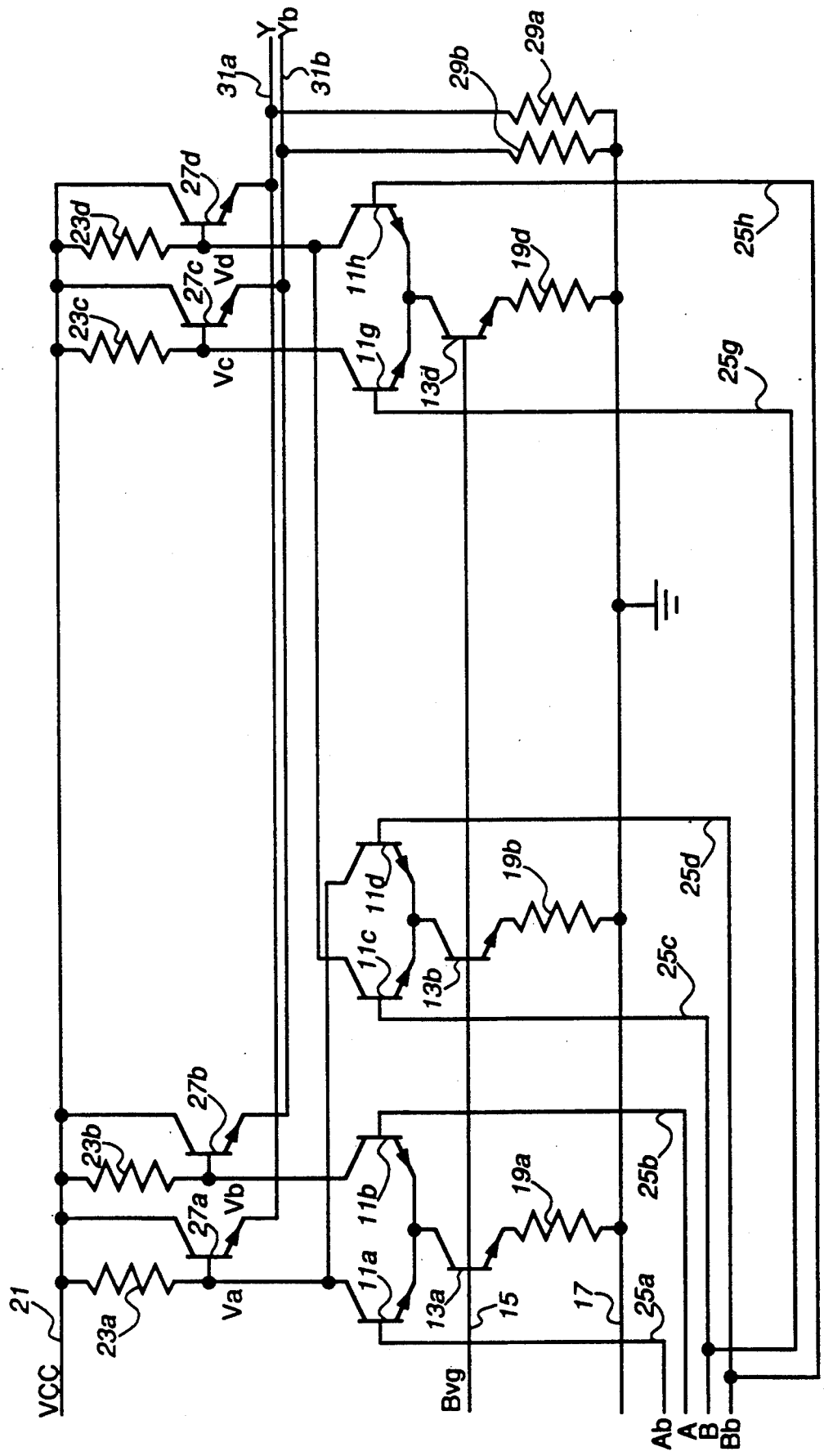
FIG. 4 is a schematic diagram of an AND circuit according to the present invention.

As shown in FIG. 4, the AND circuit has a similar circuit structure as the multiplexer shown in FIG. 1. The transistors 11e and 11f and their related circuits and connections are deleted. The input lines 25c and 25g, or the bases of the transistors 11c and 11g, are connected to each other. The input lines 25d and 25h, or the bases of the transistors 11d and 11h, are connected to each other. The output lines 31a and 31b are connected to the emitters of transistors 27a, 27d and 27b, 27c, respectively.

II. Operation of the AND circuit

In the AND circuit shown in FIG. 4, compared to the multiplexer shown in FIG. 1, the non-inverted and inverted phase components B and Bb of the second differential input signal, instead of the non-inverted and inverted phase components S and Sb of the differential select signal, are fed to the bases of the transistors 11c, 11g and 11d, 11h, respectively. To the bases of the transistors 11a and 11b, the inverted and non-inverted phase components Ab and A, respectively, instead of the non-inverted and inverted phase components A and Ab of the first differential input signal, are fed. Table IV shows the relationship between the input signal voltages, the base potentials of the transistor pairs and the output voltage.

When both first and second input signal voltages Vsa and Vsb are negative, the current Io flows in each of the transistors 11a, 11d, and 11h. When the first and second input signal voltages Vsa and Vsb are negative and positive, respectively, the transistors 11a, 11c, and 11g are conductive. When the first and second input signal voltages Vsa and Vsb are positive and negative, respectively, the transistors 11b, 11d, and 11h are conductive. When both first and second input signal voltages Vsa and Vsb are positive, the transistors 11b, 11c and 11g are conductive.

As a result, the output signals from the output lines 31a and 31b are of the AND logic on the basis of the first and second input signals.

5. OTHER CIRCUITS

The line 21 may be connected to the ground terminal (the reference potential terminal) and negative voltages may be fed to the lines 15 and 17. The circuit's function is the same as described above.

By replacing all NPN transistors to PNP transistors and altering the high and low potentials, the same function circuits as those described above are provided.

Other logic NOR, NAND and NXOR circuits are formed where the output signals are inverted.

TABLE I

| (MULTIPLEXER) | | | | | | | | |
|---|---|---|---|---|---|---|---|---|
| Input Signals | | Select | Base Potentials | | | | Output Potentials | | Output Voltage |
| 1st Vsa | 2nd Vsb | Signal Vss | Va | Vb | Vc | Vd | V(Y) | V(Yb) | V(Y)-V(Yb) |
| − | − | − | VCC | VCC-RIo | VCC-RIo | VCC-2RIo | VCC-RIo | VCC | -RIo |
| − | + | − | VCC | VCC-RIo | VCC-2RIo | VCC-RIo | VCC-RIo | VCC | -RIo |
| + | − | − | VCC-RIo | VCC | VCC-RIo | VCC-2RIo | VCC | VCC-RIo | RIo |
| + | + | − | VCC-RIo | VCC | VCC-2RIo | VCC-RIo | VCC | VCC-RIO | RIo |
| − | − | + | VCC-RIo | VCC-2RIo | VCC | VCC-RIo | VCC-RIo | VCC | -RIo |
| − | + | + | VCC-RIo | VCC-2RIo | VCC-RIo | VCC | VCC | VCC-RIo | RIo |
| + | − | + | VCC-2RIo | VCC-RIo | VCC | VCC-RIo | VCC-RIo | VCC | -RIo |
| + | + | + | VCC-2RIo | VCC-RIo | VCC-RIo | VCC | VCC | VCC-RIO | RIo |

TABLE II

| (XOR) | | | | | | | | |
|---|---|---|---|---|---|---|---|---|
| Input Signals | | Base Potentials | | | | Output Potentials | | Output Voltage |
| 1st Vsa | 2nd Vsb | Va | Vb | Vc | Vd | V(Y) | V(Yb) | V(Y)-V(Yb) |
| − | − | VCC | VCC-2RIo | VCC-RIo | VCC-RIo | VCC-RIo | VCC | -RIo |
| − | + | VCC-RIo | VCC-RIo | VCC | VCC-2RIo | VCC | VCC-RIo | -RIo |

TABLE II-continued (XOR)

| Input Signals | | Base Potentials | | | | Output Potentials | | Output Voltage |
|---|---|---|---|---|---|---|---|---|
| 1st Vsa | 2nd Vsb | Va | Vb | Vc | Vd | V(Y) | V(Yb) | V(Y)-V(Yb) |
| + | − | VCC-RIo | VCC-RIo | VCC-2RIo | VCC | VCC | VCC-RIo | RIo |
| + | + | VCC-2RIo | VCC | VCC-RIo | VCC-RIo | VCC-RIo | VCC | −RIo |

TABLE III (OR)

| Input Signals | | Base Potentials | | | | Output Potentials | | Output Voltage |
|---|---|---|---|---|---|---|---|---|
| 1st Vsa | 2nd Vsb | Va | Vb | Vc | Vd | V(Y) | V(Yb) | V(Y)-V(Yb) |
| − | − | VCC | VCC-RIo | VCC-RIo | VCC-RIo | VCC-RIo | VCC | −RIo |
| − | + | VCC-RIo | VCC-RIo | VCC | VCC-RIo | VCC | VCC-RIo | RIo |
| + | − | VCC-RIo | VCC | VCC-RIo | VCC-RIo | VCC | VCC-RIo | RIo |
| + | + | VCC-2RIo | VCC | VCC | VCC-RIo | VCC | VCC-RIo | RIo |

TABLE IV (AND)

| Input Signals | | Base Potentials | | | | Output Potentials | | Output Voltage |
|---|---|---|---|---|---|---|---|---|
| 1st Vsa | 2nd Vsb | Va | Vb | Vc | Vd | V(Y) | V(Yb) | V(Y)-V(Yb) |
| − | − | VCC-2RIo | VCC | VCC | VCC-RIo | VCC-RIo | VCC | −RIo |
| − | + | VCC-RIo | VCC | VCC-RIo | VCC-RIo | VCC-RIo | VCC | −RIo |
| + | − | VCC-RIo | VCC-RIo | VCC | VCC-RIo | VCC-RIo | VCC | −RIo |
| + | + | VCC | VCC-RIo | VCC-RIo | VCC-RIo | VCC | VCC-RIo | RIo |

What is claimed is:

1. A differential ECL circuit comprising:
   first, second, third and forth transistor pairs, each comprising first and second transistors whose emitters are connected to each other;
   first, second, third and forth constant current sources, each being connected between the connected emitters of each respective transistor pair and a first potential terminal;
   four load resistors connected between the first and second transistors' collectors of the first and forth transistor pairs and a second potential terminal;
   the first and second transistors' collectors of the second transistor pair being connected to the second and first transistor's collectors of the first transistor pair, respectively;
   the first and second transistors' collectors of the third transistor pair being connected to the second and first transistor's collectors of the forth transistor pair, respectively;
   means for providing a first differential input signal between the bases of the first and second transistors of the first transistor pair and between the bases of the first and second transistors of the forth transistor pair;
   means for providing a second differential input signal between the bases of the second and first transistors of the second transistor pair and between the bases of the first and second transistors of the third transistor pair; and
   first, second, third and fourth emitter follower transistors, the emitters of the first and second emitter follower transistors being connected to the first potential terminal through a first emitter resistor, the emitters of the third and forth emitter follower transistors being connected to the first potential terminal through a second emitter resistor, the bases of the first and second emitter follower transistors being connected to the first and second transistors' collectors of the first transistor pair, respectively, and the bases of the third and fourth emitter follower transistors being connected to the first and second transistors' collectors of the fourth transistor pair, respectively,
   whereby a differential output signal of an XOR or non-XOR logic based on the first and second differential input signals is provided across the first and second emitter resistors.

2. A differential ECL circuit comprising:
   first, second and third transistor pairs, each comprising first and second transistors whose emitters are connected to each other;
   first, second and third constant current sources, each being connected between the connected emitters of each respective transistor pair and a first potential terminal;
   four load resistors connected between the first and second transistors' collectors of the first and third transistor pairs and a second potential terminal;
   the first and second transitors' collectors of the second transistor pair being connected to the second transistor's collector of the third transistor pair and to the first transistor's collector of the first transistor pair, respectively;
   means for providing a first differential input signal between the bases of the first and second transistors of the first transistor pair;
   means for providing a second differential input signal between the bases of the second and first transistors of the second transistor pair and between the bases of the second and first transistors of the third transistor pair; and
   first, second, third and fourth emitter follower transistors, the emitters of the first and fourth emitter follower transistors being connected to the first potential terminal through a first emitter resistor and the emitters of the second and third emitter follower transistors being connected to the first potential terminal through a second emitter resistor, the bases of the first and second emitter follower transistors being connected to the first and second transistor's collectors of the first transistor pair, respectively, and the bases of the third and fourth emitter follower transistors being connected to the first and second transistor's collectors of the third transistor pair, respectively, whereby a differential output signal of an OR or NOR logic based on the first and second differential input signals is provided across the first and second emitter resistors.

3. A differential ECL circuit comprising:

first, second and third transistor pairs, each comprising first and second transistors whose emitters are connected to each other;

first, second and third constant current sources, each being connected between the connected emitters of each respective transistor pair and a first potential terminal;

four load resistors connected between the first and second transistors' collectors of the first and third transistor pairs and a second potential terminal;

the first and second transistors' collectors of the second transistor pair being connected to the second transistor's collector of the third transistor pair and to the first transistor's collector of the first transistor pair, respectively;

means for providing a first differential input signal between the bases of the second and first transistors of the first transistor pair;

means for providing a second differential input signal between the bases of the first and second transistors of the second transistor pair and between the bases of the first and second transistors of the third transistor pair; and first, second, third and fourth emitter follower transistors, the emitters of the first and fourth emitter follower transistors being connected to the first potential terminal through a first emitter resistor, the emitters of the second and third emitter follower transistors being connected to the first potential terminal through a second emitter resistor, the bases of the first and second emitter follower transistors being connected to the first and second transistors' collectors of the first transistor pair, respectively, and the bases of the third and fourth emitter follower transistors being connected to the first and second transistors' collectors of the third transistor pair, respectively, whereby a differential output signal of an AND or NAND logic based on the first and second differential input signals is provided across the first and second emitter resistors.

* * * * *